United States Patent
Estevez-Garcia

(10) Patent No.: US 6,586,721 B2
(45) Date of Patent: Jul. 1, 2003

(54) MOVEMENT DETECTOR INCLUDING A VERTICAL RESONATOR AND RECEIVER DISPOSED WITHIN AN OPEN HOUSING

(75) Inventor: Jaime Estevez-Garcia, München (DE)

(73) Assignee: Osram Opto Semiconductors GmbH & Co. OHG, Regensburg (DE)

( * ) Notice: Subject to any disclaimer, the term of this patent is extended or adjusted under 35 U.S.C. 154(b) by 40 days.

(21) Appl. No.: 09/795,681

(22) Filed: Feb. 28, 2001

(65) Prior Publication Data
US 2001/0035492 A1 Nov. 1, 2001

Related U.S. Application Data

(63) Continuation of application No. PCT/DE99/02591, filed on Aug. 18, 1999.

(30) Foreign Application Priority Data

Aug. 28, 1998 (DE) .......................... 198 39 305

(51) Int. Cl.[7] .............................. G06M 7/00; H01J 40/14
(52) U.S. Cl. .................. 250/221; 250/239; 250/559.29; 250/559.32; 257/80; 257/81; 257/82
(58) Field of Search ................................ 250/239, 221, 250/559.29, 214.1, 559.32, 370.14; 356/480; 307/117; 327/514; 257/82, 626, 80, 81, 431, 433, 435; 369/44; 372/29.021, 36, 43, 96

(56) References Cited

U.S. PATENT DOCUMENTS

| | | | |
|---|---|---|---|
| 3,697,762 A | 10/1972 | Kurtz | |
| 3,842,263 A | 10/1974 | Kornrumpf et al. | |
| 4,340,813 A | * 7/1982 | Sauer | 250/221 |
| 5,225,689 A | * 7/1993 | Buckle et al. | 250/561 |
| 5,650,612 A | * 7/1997 | Criswell et al. | 250/226 |
| 5,666,376 A | * 9/1997 | Cheng | 372/50 |
| 5,753,929 A | 5/1998 | Bliss | |
| 5,757,741 A | 5/1998 | Jiang et al. | |

FOREIGN PATENT DOCUMENTS

| | | |
|---|---|---|
| DE | 2824583 C3 | 10/1985 |
| DE | 3633181 A1 | 4/1988 |
| DE | 3929085 A1 | 3/1990 |
| DE | 4304343 A1 | 8/1994 |
| DE | 4337005 A1 | 5/1995 |
| DE | 29802763 U1 | 5/1998 |
| DE | 19828069 A1 | 1/1999 |
| EP | 0751510 A2 | 1/1997 |
| EP | 0786839 A1 | 7/1997 |

OTHER PUBLICATIONS

Patents Abstracts of Japan; Pub. No. 09321597; Pub. Dt. Dec. 12, 1997; Applicant—Mitsumi Electric Co. Ltd.

\* cited by examiner

Primary Examiner—Que T. Le
Assistant Examiner—Christopher W. Glass
(74) Attorney, Agent, or Firm—Cohen, Pontani, Lieberman & Pavane

(57) ABSTRACT

A reflected light barrier has a housing with a base element. A semiconductor light emitter and a semiconductor light receiver are arranged on the base element in such a way that there is no free-standing partition between the light emitter and light receiver optically screening the light receiver from the light emitter. The light emitter has such a low beam divergence that the crosstalk from the light emitter to the light receiver is kept within operating tolerances.

47 Claims, 2 Drawing Sheets

MOVEMENT DETECTOR INCLUDING A VERTICAL RESONATOR AND RECEIVER DISPOSED WITHIN AN OPEN HOUSING

CROSS-REFERENCE TO RELATED APPLICATION

This application is a continuation of copending international application PCT/DE99/02591, filed Aug. 18, 1999, which is designated to the United States.

BACKGROUND OF THE INVENTION

The present invention relates to reflective radiation barriers and more particularly to a barrier having a housing with a base element embedded therein. The base houses a radiation emitter or transmitter and receiver or detector, all of which may be monolithic semiconductors built on a common substrate. The radiation may be light and the present invention will be discussed with respect to light emission. However, the present invention is not limited to light applications and may include other radiation wavelengths as will be discussed below.

Reflective or reflexive light barriers or an apparatus for detecting motion of an object may take many forms and applications as shown in the prior art. For example, application of the barriers may be for space detection, as well as tracking and automation systems. The barriers may frequently come in the form of miniature components and be applied in consumer and entertainment electronics. The barriers are increasingly used for monitoring mechanical device components such as video player load flaps and sleds of CD drives. Essential criteria for such applications include size, degree of miniaturization, and cost.

U.S. Pat. No. 3,842,263 sets out a photoelectric switching device wherein the light transmitter and the light receiver are each placed in separate, channel-shaped indentations of common cased body. The channel-shaped indentation associated with the light transmitter serves as a directional for the light emitted by the transmitter. The partition which runs between the two indentations avoids cross-talk between emitted light and the receiver.

German Patent DE 36 33 181 A1 sets out a reflected light barrier wherein the light transmitter and the light receiver are placed on a common semiconductor substrate. A free-standing screen, produced from the semiconductor substrate by an etching step, is provided for the optical separation of light transmitter and light receiver.

U.S. Pat. No. 3,697,762 sets out a light scanner having a partition between an LED (luminous source) and a photo element (light receiver) in order to avoid cross talk between the source and receiver.

German Patent DE 39 29 085 A1 sets out a reflex light barrier using LED's as light transmitters.

Additional reflective light barriers and light scanners are described in the German patents DE 298 02 763 U1, DE 43 04 343 A1 and DE 28 24 583 C3, which set out input as well as output optics and are only marginally appropriate for miniaturization.

Still additional reflective light barriers are set out in U.S. Pat. Nos. 5,753,929 and 3,842,263; German Patents DE 43 37 005 A1, DE 39 29 085 A1 and DE 198 28 069 A1; European Patent Applications EP 0 786 839 A1 and EP 0 751 510 A2; and Japanese Abstract 09321597.

BRIEF SUMMARY OF THE INVENTION

It is an advantage of the present invention to provide a reflective light barrier with a high degree of miniaturization potential at reduced costs. Herein, the light transmitter may be a vertically emitting semiconductor transmitter with a vertical resonator such as a vertical cavity surface emitting laser (VCSEL) or a resonant cavity light emitting diode (RCLED). Through use of a vertically emitting semiconductor transmitter with a vertical resonator, especially a VCSEL or RCLED, low beam divergence can be obtained. Accordingly, cross-talk between transmitter and receiver can be kept below a working tolerance of the present apparatus. As such, a partition is no longer necessary. In practice, a certain degree of cross-talk may be tolerated. The particular threshold may vary depending upon application and optical path length, reflectivity of the detected object, and the like. In addition, as VCSELs generally display a lower beam divergence than RCLEDs, the former may be applied where the latter divergence is unacceptably high.

By avoiding use of a free-standing partition which is common in the art, the possibility now exists for closer placement of the transmitter and receiver within the, present apparatus, A reflective light barrier with overall smaller dimensions is therefore possible. A preferred design of the invention includes a maximum lateral casing size equal to or less than 2.5 mm. Alternatively, the casing size may be smaller than 0.5 mm.

The light transmitter can be built from a multiple number of single light transmitter elements. The elements may, for example, be arranged in an uni-dimensional row or a two-dimensional array. By optimizing the number of transmitter elements, the geometrical arrangement of the transmitters, the orientation of the transmitter-arrangement relative to the light receiver, the intensity of light, and other parameters, a minimization of cross-talking can be obtained for a select casing size and distance. Hence, cross talk may be minimized between transmitter and receiver.

A further reduction of cross-talk may be obtained via use of polarizers. In particular, a polarizer may be placed in the beam path incident upon the light receiver. Because the object location, beam source and receiving point are known, it will be known in advance what effect the detected object will have on the polarity of light reflected off it. As such, the polarizer placed on the receiver may be preselected so as to pass only light reflected by the object. Other light, including that emitted by the transmitter would not pass. As such, the effectiveness of the present apparatus increases and the need for a light partition between the transmitter and receiver is obviated. A second possibility may be the inclusion of a polarizer on the transmitter as well. Herein the transmitter polarizer may be at about 90 degrees to the receiver polarizer thereby again obviating the need for a barrier.

Still a further possibility includes the use of an optical filter. The filter may be a day light filter and/or a band pass filter. The filter may be placed in the incident beam path upstream from the light receiver in order to suppress stray day light. The usage of a day light filter is preferable if the emission wavelength of the light transmitter lies outside of the visible area (for example at approx. 1 μm). Selection and use of a band pass filter may be effected such that its transmitted wavelength substantially corresponds to the emission wavelength of the light transmitter.

Still a further possibility includes use of a modulator to modulate the light transmitted by the light transmitter and a demodulator to distinguish between received, modulated reflected light and received, non-modulated stray light.

Still a further possibility includes use of an integrated circuit (IC) coupled with the light transmitter and/or the light receiver. The IC may be located in the casing and be provided according to a functional design of the invention. The integrated circuit can either comprise a driver switching circuit for the light transmitter as well as a scoring switching circuit. If the reflected light barrier is operated with modulated emission light, the integrated circuit can be additionally equipped with a driver-equipped with a modulator stage and scoring circuit-coupled to the demodulator.

The transmitter, receiver, and integrated circuit may be formed monolithically on a common semiconductor substrate thereby creating elements for an especially high degree of miniaturization.

The structure of the present invention may include a circular casing embedded in the base housing. The base may include at least four internally mounted surfaces having through holes and electrical contacts. Accordingly, the transmitter and receiver may be applied on the contact surface. The application may be electrical bonding as well as possible electrical cross bonding to one of the remaining contact surfaces. Such casings are standard in the art and may be produced by large scale manufacturing for the absorption of three luminescent diodes of the elementary colors green, red, blue, to be used as color picture point in a display. These casings may therefore be economical and may further contribute to an overall cost reduction of the present invention.

The invention is explained in greater detail below and by reference to exemplary embodiments shown in the drawings wherein like numerals refer to equivalent elements.

DETAILED DESCRIPTION OF THE INVENTION

Figure 1:
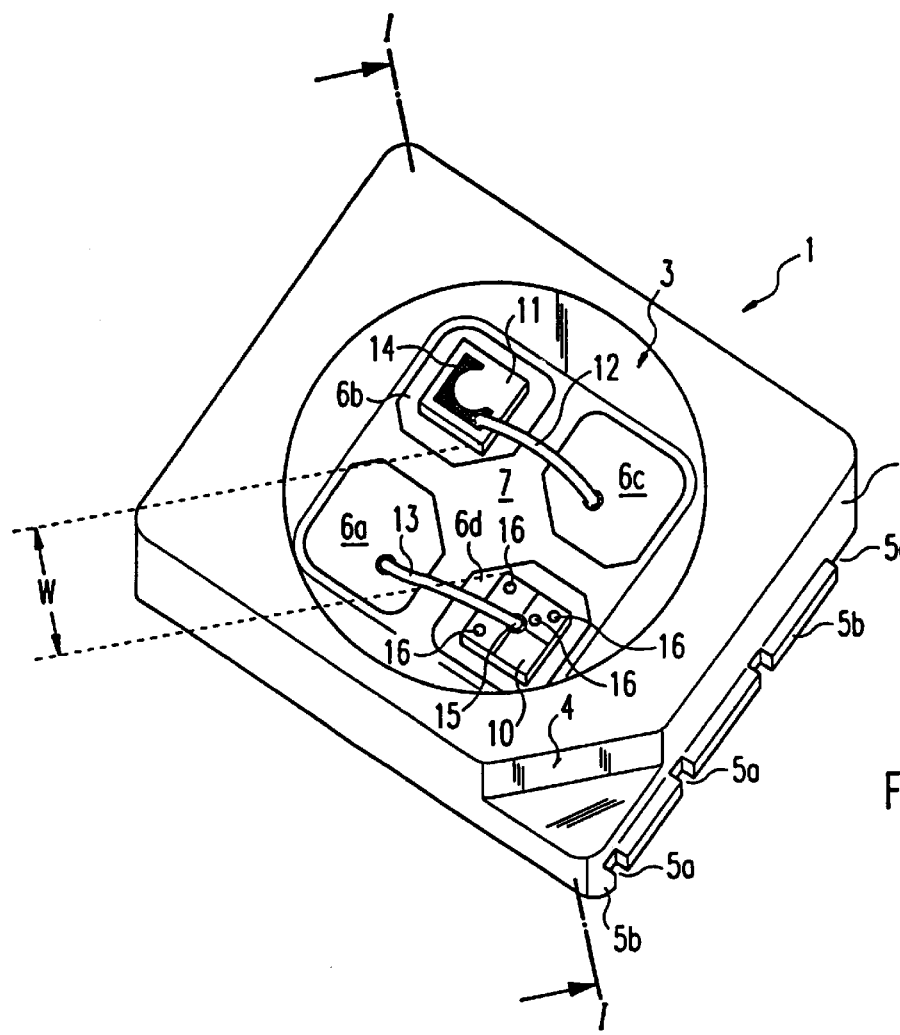
FIG. 1 depicts a perspective view of a reflected light barrier according to the present invention.

As depicted in FIG. 1, the present reflected light barrier 1 comprises a plastic casing 2 with an essentially rectangular circumferential contour. The casing may be manufactured from other known materials envisioned by one skilled in the art. The casing 2 is provided with a central opening 3. The lateral dimensions of the casing may measure about 2–3 mm in the depicted embodiment. The height of the casing may measure about 2 mm. In addition to the depicted embodiment, an essentially smaller casing 2 is possible (with an integrated reflected light barrier), wherein the casing dimensions (width, length, and height) are each less than 0.5 mm.

The casing 2 includes a dropped corner portion 4 which facilitates the handling of the casing 2 during automated or manual manufacturing sequences (for example an insertion step). The casing further includes centering recesses 5a interspersed between and among centering projections 5b set out along the circumference for further alignment of the casing.

Figure 2:
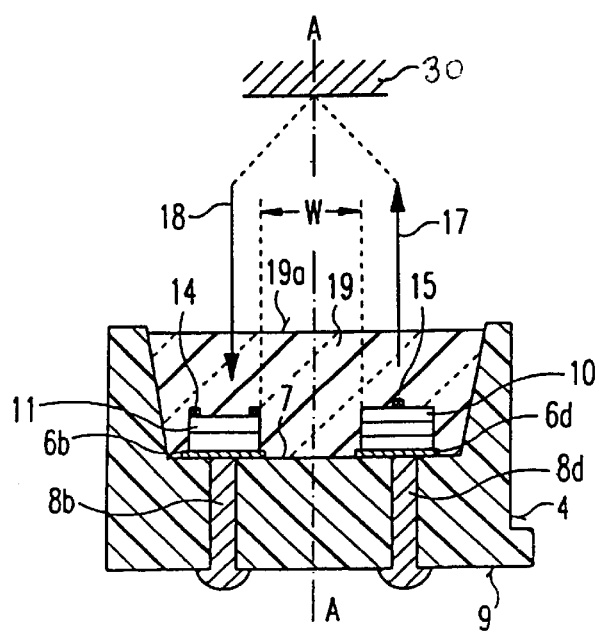
FIG. 2 depicts a sectional view of the reflected light barrier of FIG. 1 along the line I—I.

The central opening 3 may be ground through the top of casing 2 to the casing bottom 7. Four electrical metal contact surfaces (bond pads) 6a, 6b, 6c, 6d are placed on the surface of the casing bottom 7. Although four pads are depicted, the number of pads is not limited to that number and may include any number envisioned by the skilled artisan. The contact surfaces 6a to 6d are spaced and are electrically insulated and otherwise not in electrical contact. As shown in FIG. 2, contacting pins 8b, 8d, which project from the bottom side 9 of the casing bottom 7, and run there through, are provided for electrical bonding of the contact surfaces 6a to 6d.

A light transmitter 10 is placed on contact surface 6d. A light receiver 11 is placed on contact surface 6b. Both transmitter and receiver have two electrical contacts. The first is in electrical contact with surfaces 6b and 6d respectively. The second is connected to surfaces 6a and 6c respectively. The receiver 11 includes a sickle shaped metal film 14 bonded to contact surface 6c via wire 12. Likewise, transmitter 10 is connected with bond wire 13 extending from the contact surface 6a to a center contact 15 on the surface of the transmitter.

As also depicted in FIG. 2, the distance W between transmitter 10 and receiver 11 is approx. 0.7 mm. The distance w can be less than 0.1 mm at lateral casing sizes of less than 0.5 mm.

A light transmitter 10 is placed on contact surface 6d. A light receiver 11 is placed on contact surface 6b. Both transmitter and receiver.have two electrical contacts. The first is in electrical contact with surfaces 6a and 6d respectively. The second is connected to surfaces 6b and 6c respectively. The receiver 11 includes a sickle shaped metal film 14 bonded to contact surface 6c via wire 12. Likewise, transmitter 10 is connected with bond wire 13 extending from the contact surface 6a to a center contact 15 on the surface of the transmitter.

In operation, light 17 emitted by transmitter 10 is reflected off of an object 30 and the reflection 18 is detected by receiver 11. In the present embodiment, no partition between the transmitter and receiver is needed The casing bottom 7 is planar and the transmitter and receiver are likewise coplanar. However, alternate embodiments may include a non-planar casing bottom. The absence of a free-standing partition between the transmitter and receiver enables a reduction of the lateral casing size. In addition, the absence translates into one less required component and hence an overall cost savings.

The possibility of cross talk normally exists absent a barrier between transmitter and receiver. To address this possibility, the present invention makes use of a low diverging light source, such as a VCSEL, RCLED or other such source. With such sources, present cross talk, if any, is within an acceptable tolerance for effective operation. In addition to low diverging light sources, it is within the scope of the present invention to make use of other means to reduce cross talk. For example, cross talk can herein be reduced by use of polarizers (not shown). The polarizers may be inserted in to the beam paths emitting from the transmitter 10 and/or incident upon the receiver 11. Because the object location, beam source and receiving point are known, it will be known in advance what effect the detected object will have on the polarity of light reflected off of it. As such, the polarizer placed on the receiver may be preselected so as to select or pass only light of that polarity. Accordingly, other light, including that emitted by the transmitter would not pass. As such, the effectiveness of the present apparatus increases and the need for a light barrier between the transmitter and receiver is again obviated. An additional possibility may be the inclusion of a polarizer on the transmitter as well. Herein the transmitter polarizer may be at 90 degrees to the receiver polarizer thereby again obviating the need for a barrier. An additional possibility is the inclusion of polarizers with both the transmitter and receiver such that the polarizers select different polarization states and discard others. As such, light emitted by the transmitter would not pass the receiver polarizer. Rather, only light reflected off of the object for which the polarizer is already preset to select, becomes incident upon the receiver.

An additional option is to model the casing bottom in a step wise manner (not shown) such that the transmitter 10 is not on the same plane as the receiver 11. Herein, the transmitter may be either below or above the receiver. The casing bottom can be so modeled by means and methods known to one skilled in the art.

An additional option arises in the use of several individual transmitters. For example, when several single VCSELs 16 in the light transmitter 10 are employed, the cross-talk can be minimized by optimizing the geometrical arrangement of the single light transmitters (row, array or overall geometry arrangement) as well as by the selection of an appropriate orientation (for the arrangement) relative to the light receiver 11 such that a minimum of light passes directly between transmitter and receiver.

An additional option arises with the suppression of day light. This suppression is desired not only for the reduction of cross talk, but also for the enhancement of the signal to noise ratio as well as the possibility of using particular wavelength sources and related detectors not within the visible spectrum. Herein, for example, a daylight filter or a band-pass filter can be placed in the beam path upstream from the light receiver 11. An additional option for improving the signal to noise ratio, distinguishing between desired and other incident light, and other benefits, arise from modulating emitted light 17 and appropriately demodulating received light at receiver 11. Both may be driven by an appropriate IC as known to one skilled in the art.

The circumferential interior walls of the central opening 3 can be further developed as a reflector for the light receiver 11 as known to one skilled in the art. Reflecting walls serve to concentrate the reflected light 18 on the light receiver 11, thereby enhancing the resulting signal. If the light receiver 11 is placed locally in the central opening 3, the reflector may be asymmetrical with respect to casing center line 1. As such, light will be reflected by the reflector into the receiver. The reflector can for example be realized by a metallic mirror coating of the circumferential interior walls of the central opening 3.

The central opening 3 may be filled with a compound, such as transparent epoxy 19. The epoxy 19 serves to protect transmitter 10 and receiver 11 among other components. Preferably, the epoxy 19 should have a high transparency and homogeneity so as to keep leakage of the emitted light 17 in the epoxy 19 as low as possible. Leaking or scattered light within or caused by the epoxy may be picked up by the receiver 11, thereby increasing cross talk, decreasing the signal to noise ratio, and the like. Furthermore, such scattering decreases the strength of the emitted light 17 thereby hampering the effectiveness of the inventive apparatus. To avoid leakage produced by separation between light transmitter 10 and epoxy 19, especially in the transition region, the epoxy 19 should preferably have a similar thermal coefficient of expansion to the semiconductor material of the light transmitter 10.

The emission surface 19a of the epoxy 19 may be planar or concave so that reflected emitted light 17 at the emission surface 19a is reflected or otherwise directed away from the direction of the light receiver. Furthermore, the epoxy surface 19a can be provided with an antireflective coating, for example an optical λ/2 coating.

Figure 3:
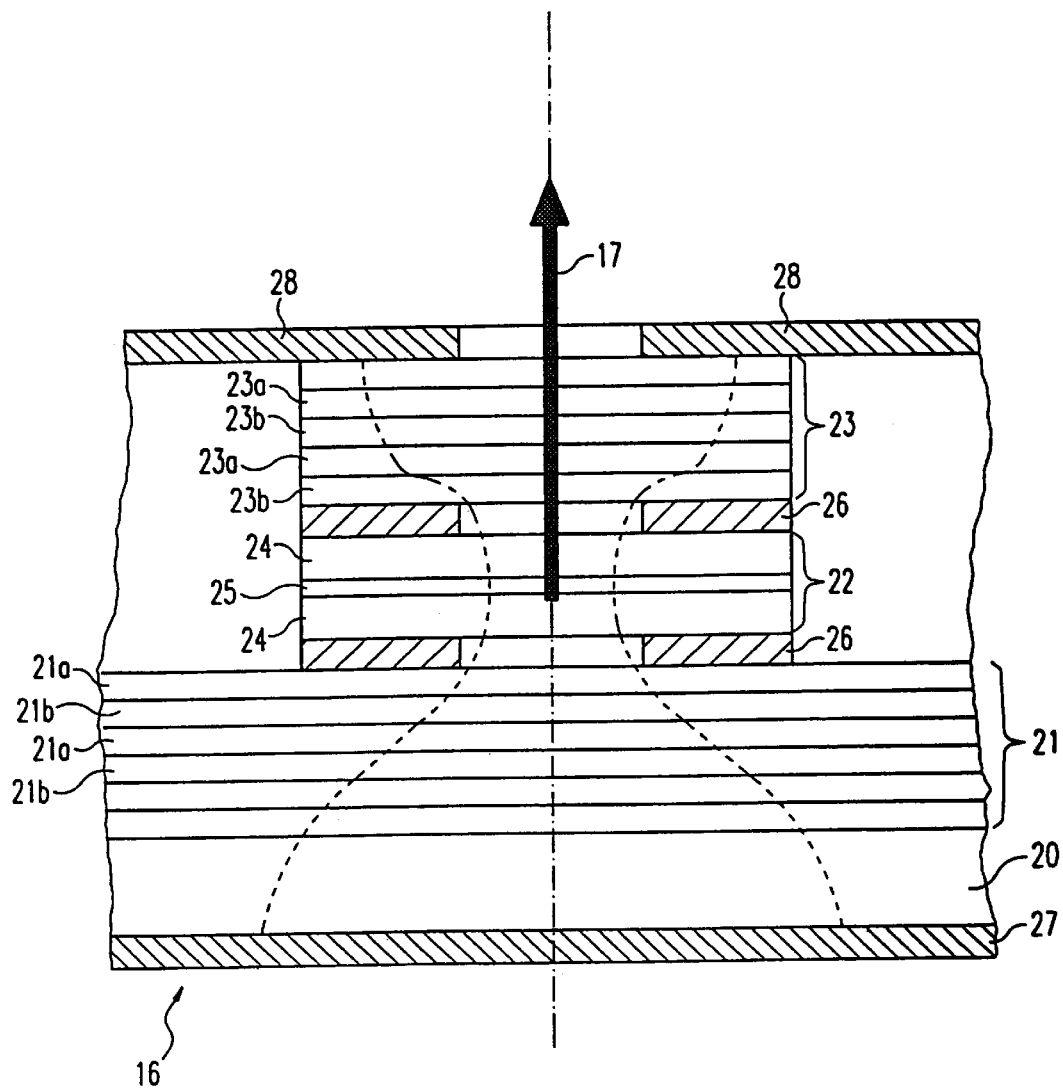
FIG. 3 depicts a diagrammatic view of the structure of a VCSEL.

FIG. 3 shows the structure of a VCSEL 16 in a schematic view. The VCSEL 16 includes a substrate (for example GaAs) 20, on which a first stack 21 of epitaxially applied mirror stacks 21a, 21b, an active zone 22: and a second stack 23 of mirror stacks 23a, 23b are placed. The layered stacks 21 and 23 may comprise alternating GaAs layers 21a, 23a with low band gaps. Likewise, layers 21b, 23b of AlxGa1-xAs with a high aluminum content (for example x=0,96) and a high band gap may also be used. The active zone 22 includes a quantum well layer 25 between two barrier layers 24. Two optional, insulating layers may be used with a central aperture (26). These layers may serve to control the lateral mode profile of the emitted light 17. Metallic bonding layers 27, 28 are placed on the bottom and top of the described layer structure. The reflectivity of the first and second mirror layer stack 21, 23 may be above 95% for a VCSEL so as to enable a laser-operation. A RCLED may comprise the layer structure 20–23 presented in FIG. 3. The essential difference to a VCSEL 16 lies in that the reflectivity of the mirror layer stack 21, 23 may be lower to about 90%.

The invention being thus described, it will be obvious that the same may be varied in many ways. Such variations are not to be regarded as a departure from the spirit and scope of the invention, and all such modifications would be obvious to one skilled in the art are intended to be included within the scope of the following claims.

I claim:

1. An apparatus for detecting movement of an object by reflecting radiation off of said object and detecting said reflected radiation, said apparatus comprising:
   a base housing having a top and a bottom;
   an opening formed in said top, said opening extending into said base towards said bottom, said opening defining a floor within said base housing;
   at least one transmitter for transmitting said radiation, said at least one transmitter is housed within said opening and includes a vertical resonator; at least one receiver for detecting said reflected radiation, said at least one receiver housed within said opening; and
   space between said transmitter and receiver, within said opening, is free from a radiation partition.

2. The apparatus according to claim 1, wherein said transmitter comprises at least one semiconductor radiation source.

3. The apparatus according to claim 2, wherein said transmitter comprises at least one vertical cavity surface emitting laser.

4. The apparatus according to claim 2, wherein the transmitter comprises at least one resonant cavity light emitting diode.

5. The apparatus according to claim 1, wherein said radiation is visible light.

6. The apparatus according to claim 1, wherein said base is less than 2.5 mm long.

7. The apparatus according to claim 1, wherein said base is less than 1.0 mm long.

8. The apparatus according to claim 7, wherein said base is substantially rectangular.

9. The apparatus according to claim 1, further comprising a polarizer for polarizing radiation incident upon said receiver.

10. The apparatus according to claim 9, further comprising a second polarizer for polarizing radiation emitted by said transmitter.

11. The apparatus according to claim 10, wherein said first and second polarizers select different polarization states.

12. The apparatus according to claim 1, further comprising an optical filter for filtering radiation incident upon said receiver.

13. The apparatus according to claim 12, wherein said optical filter is a day light filter.

14. The apparatus according to claim 12, wherein said filter is a band pass filter.

15. The apparatus according to claim 14, wherein said transmitter emits radiation substantially within a band of wavelengths passed by the band pass filter.

16. The apparatus according to claim 1, further comprising:
   a modulator for modulating radiation emitted by said transmitter; and
   a demodulator for demodulating radiation incident upon said receiver.

17. The apparatus according to claim 15, wherein the rate of modulation substantially matches the rate of demodulation.

18. The apparatus according to claim 1, further comprising an integrated circuit housed in said base, said integrated circuit being in electrical communication with said transmitter and used for driving said transmitter.

19. The apparatus according to claim 1, further comprising an integrated circuit housed in said base, said integrated circuit being in electrical communication with said receiver and used for driving said receiver.

20. The apparatus according to claim 18, wherein said integrated circuit and receiver are monolithic structures built on a common semiconductor substrate.

21. The apparatus according to claim 17, wherein said transmitter and receiver are monolithic structures built on a common semiconductor substrate.

22. The apparatus according to claim 1, wherein said transmitter and receiver are coaxial.

23. The apparatus according to claim 1, wherein said transmitter and receiver are coplanar.

24. The apparatus according to claim 1, wherein said transmitter and receiver are not coplanar.

25. The apparatus according to claim 1, wherein said base further houses reflector means for reflecting radiation.

26. The apparatus according to claim 25, wherein said opening comprises internal walls and said reflector means are applied to said internal walls.

27. The apparatus according to claim 26, wherein said reflector means reflects radiation from said transmitter to said object and further reflects radiation from said object to said receiver.

28. The apparatus according to claim 1, further comprising:
   at least four first electrical contacts formed on said floor;
   second electrical contacts in electrical contact with said at least four first electrical contacts, said second electrical contacts formed through said bottom via throughholes;
   said transmitter formed on a first of said at least four first electrical contacts and bonded to a second of said at least four first electrical contacts; and
   said receiver formed on a third of said at least four first electrical contacts and bonded to a fourth of said at least four first electrical contacts.

29. The apparatus according to claim 1, wherein said opening is filled with a transparent protective filing.

30. The apparatus according to claim 29, wherein said filling is epoxy.

31. A method of forming an apparatus for detecting movement of an object by reflecting radiation off of said object and detecting said radiation comprising the steps of:
   forming a base having a top and a bottom;
   forming an opening within said top, said opening descending within said base towards said bottom;
   forming a radiation transmitter within said opening, said transmitter including a vertical resonator;
   forming a radiation receiver within said opening for detecting said reflected radiation; and
   forming a space between said receiver and transmitter within said opening without a radiation partition.

32. The method according to claim 31, further comprising the step of forming electrical contacts within said opening and forming said transmitter and receiver on said contacts.

33. The method according to claim 31, further comprising the step of forming a reflector within said opening, said reflector reflecting radiation from outside said opening incident upon said receiver.

34. The method according to claim 33, wherein said step of forming a reflector further comprises the step of forming said reflector to reflect radiation from said transmitter outside said opening.

35. The method according to claim 31, further comprising the step of forming a polarizer for polarizing radiation incident upon said receiver.

36. The method according to claim 35, further comprising the step of forming a second polarizer for polarizing radiation emitted by said transmitter and said first and second polarizers select different polarization states.

37. The method according to claim 31, further comprising the step of forming a filter for filtering radiation incident upon said receiver.

38. The method according to claim 37, further comprising the step of limiting the emission of said transmitter to wavelengths passed by said filter.

39. The method according to claim 31, further comprising the step of forming a modulator for modulating radiation emitted by said transmitter.

40. The method according to claim 39, further comprising the step of forming a demodulator for demodulating radiation incident upon said receiver.

41. The method according to claim 31, further comprising the steps of:
   forming an integrated circuit for driving said transmitter; and
   building said transmitter and integrated circuit as monolithic structures on a common semiconductor substrate.

42. The method according to claim 31, further comprising the steps of:
   forming an integrated circuit for driving said receiver; and
   building said receiver and integrated circuit as monolithic structures on a common semiconductor substrate.

43. The method according to claim 31, further comprising the step of filling said opening with a transparent protective filling.

44. A method of forming an apparatus for detecting movement of an object by reflecting radiation off of said object and detecting said radiation, said method comprising the steps of:
   forming abase having a top and a bottom;
   forming an opening within said base, said opening descending within said base towards said bottom;
   forming a plurality of first electrical contacts within said opening;
   forming second electrical contacts in through holes through said base, individual second electrical contacts having a first connection to said first electrical contacts and a second connection outside said base;
   forming at least one radiation transmitter on a first electrical contact, said transmitter including a resonator;
   forming at least one radiation receiver on another first electrical contact; and
   forming space between said receiver and transmitter within said opening without a radiation partition.

45. The method according to claim 31, wherein said base is less than 2.5 mm long.

46. The method according to claim 31, wherein distance between said transmitter and receiver is less than 0.7 mm.

47. The apparatus according to claim 1, wherein distance between said at least one transmitter and at least one receiver is less than 0.7 mm.

* * * * *